United States Patent [19]

Stickel et al.

[11] Patent Number: 4,976,358
[45] Date of Patent: Dec. 11, 1990

[54] APPARATUS FOR GUIDING AND HOLDING PRINTED CIRCUIT BOARDS

[75] Inventors: Heinz Stickel, Groebenzell; Peter Reihl, Munich, both of Fed. Rep. of Germany

[73] Assignee: Siemens Aktiengesellschaft, Berlin and Munich, Fed. Rep. of Germany

[21] Appl. No.: 502,522

[22] Filed: Mar. 30, 1990

[30] Foreign Application Priority Data

Mar. 31, 1989 [DE] Fed. Rep. of Germany ... 8903958[U]

[51] Int. Cl.$^5$ ............................................. H02B 1/02
[52] U.S. Cl. ..................................... 211/41; 361/415
[58] Field of Search .................. 211/41; 361/397, 399, 361/398, 415

[56] References Cited

U.S. PATENT DOCUMENTS

| | | | |
|---|---|---|---|
| 3,899,721 | 8/1975 | Borchard et al. | 211/41 X |
| 4,007,403 | 2/1977 | Fiege | 211/41 X |
| 4,019,099 | 4/1977 | Calabro | 211/41 X |
| 4,022,326 | 5/1977 | Marconi | 211/41 |
| 4,534,472 | 8/1985 | Hanseler et al. | 211/41 |
| 4,779,744 | 10/1988 | Shely et al. | 211/41 |

Primary Examiner—Robert W. Gibson, Jr.
Attorney, Agent, or Firm—Hill, Van Santen, Steadman & Simpson

[57] ABSTRACT

Apparatus for guiding and holding printed circuit boards. For length and thickness compensation of printed circuit boards subject to length and thickness variations, the apparatus for guiding and holding printed circuit boards is essentially composed of a U-shaped rail having legs proceeding parallel to one another. The legs are oppositely corrugated along the rail. The legs are thereby fashioned such that the gap formed by them has a respective antinode at the rail ends. The legs are thereby connected only at the leg ends and at least at one of the antinodes lying therebetween, being connected by connecting webs that have retainer elements directed outward in the direction of the legs that may potentially be in an interactive connection with spring tongues.

26 Claims, 1 Drawing Sheet 4,976,358

APPARATUS FOR GUIDING AND HOLDING PRINTED CIRCUIT BOARDS

BACKGROUND OF THE INVENTION

The present invention is directed to an apparatus for guiding and holding printed circuit boards which are guided at opposite edges. The apparatus is of the type composed of an essentially U-shaped rail having at least two legs and having retainer elements directed outward in the direction of the legs and having a leg spacing of the legs that is somewhat greater when compared to the thickness of the printed circuit board and having at least one leg fashioned such that a leg spacing that falls below the thickness of the printed circuit board occurs for at least one location.

A problem with the printed circuit boards is that very great length and thickness variations repeatedly occur when integrating printed circuit boards. Using traditional printed circuit board guide rails for a specified length of a printed circuit, the printed circuit boards no longer have support for a length less than the specified length or are integrated under tension for a length greater than the specified length, resulting in arcing. When the printed circuit boards are too thin, they can rattle in the guide rails and, when they are too thick, they can seize therein.

For thickness compensation of printed circuit boards, German Utility Model Application No. G 88 12060.0 has disclosed an apparatus for guiding and holding printed circuit boards that is composed of a U-shaped rail having two retainer elements located in the proximity of the two rail ends and pointing out transversely relative to the legs. On one leg at least two pressure elements are formed for the printed circuit boards and project into the inside of the U-shaped rail. The thickness variations of the printed circuit boards can in fact be compensated for with this prior art apparatus; the length variations thereof, however, cannot be compensated.

SUMMARY OF THE INVENTION

It is therefore an object of the present invention to provide an apparatus for guiding and holding printed circuit boards, which are guided at opposite edges, that compensates for thickness variations of the printed circuit boards, which are subject to thickness and length variations, and that can also compensate for the length variations.

In an apparatus of the type initially cited, this object is inventively achieved by a novel apparatus having: the legs oppositely corrugated in the direction of the rail; a respective antinode fashioned at the ends of the rail; and connecting webs having retainer elements pointing out in a direction opposite that of the legs provided at the ends of the rail and for at least one antinode lying therebetween. These simple measures provide a printed circuit board guide rail having a variable gap width, so that thickness variations of the printed circuit boards can be compensated for. Moreover, due to the fact that outwardly directed retainer elements in counter-direction to the legs are used, there is a possibility of compensating for length variations of the printed circuit boards.

Further advantageous developments of the present invention are as follows. The connecting webs are provided with leading bevels at those inside edges proceeding transversely relative to the legs. Introduction bevels are fashioned at the inside edges of the legs at the rail ends. The retainer elements are fashioned as pins whose free ends have at least one latch element.

Furthermore, the pins can have an essentially cylindrical form and have a projection at their free end that is initially salient and subsequently tapers. In one embodiment the projection is conically fashioned. In another embodiment the projection is spherically fashioned. Furthermore, the pins can be composed of at least one half sub-member. The sub-member halves are laterally bevelled in the region of their free ends. The halves of the sub-members are arranged in pairs at a distance from one another having inside surfaces directed respectively toward one another.

In one embodiment the retainer elements have a dimension exceeding a specification in such fashion that the apparatus is displaceable parallel to the leg direction. The spring elements having a respective interactive connection with the retainer elements are provided at sides of the retainer elements, the spring elements having a spring action that compensates for the dimension exceeding the specification. The spring elements are formed by spring tongues projecting at a slant from those edges of the connecting webs proceeding transversely relative to the legs. Notchings extending respectively into the legs over the edge courses facing toward the legs are provided in the clamping regions of the spring tongues.

Due to the pin-like design of the retainer elements, the apparatus can be easily mounted by being pressed into bores of a corresponding assembly part. Spring elements may thereby hold the apparatus at a distance from the assembly part in a resilient fashion.

The latch elements provided at the free ends of the retainer elements prevent the apparatus from falling out of the appertaining bores of the assembly part. Therefore, the latch elements can have various designs. A reliable holding ability of the retainer elements in the appertaining bores is particularly achieved in that the retainer elements are arranged in respective pairs, whereby their latch elements are each respectively fashioned at only one side, namely at respective sides that are directed away from one another. This is achieved in that the retainer elements are each respectively composed of only half a sub-member. The retainer elements thereby act as spreader jaws.

By bevelling the lateral edges at the free ends of the retainer elements fashioned as halves of sub-members, the introduction of the retainer elements into the appertaining bores is improved.

The fashioning of the spring elements as spring tongues enables a one-piece manufacture of the apparatus. In particular, the apparatus can be easily fabricated as a plastic part. As a plastic part, moreover, the apparatus has good resilient properties for the resilient parts and good sliding properties for the guiding parts.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figures 1, 2:
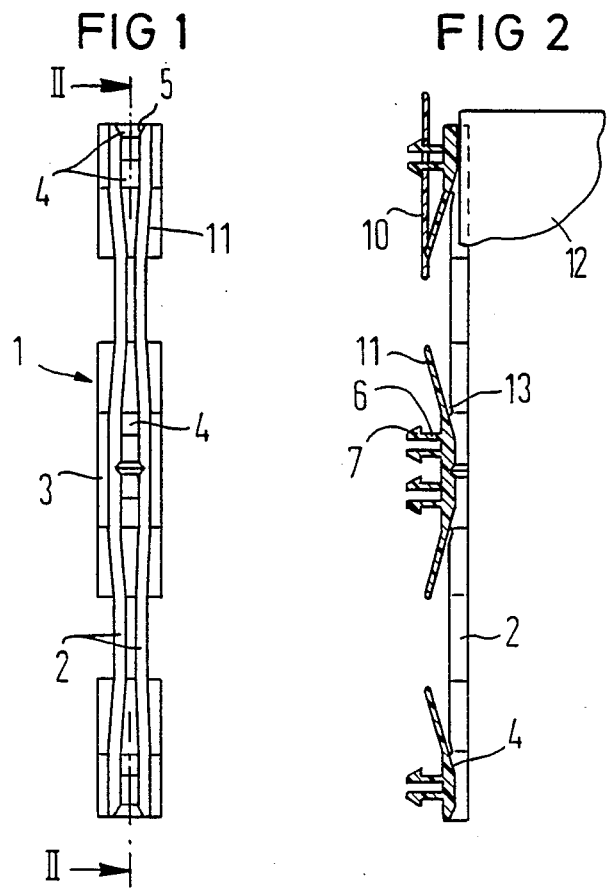
FIG. 1 is a front view of the apparatus of the present invention.
FIG. 2 is a side view of the apparatus of FIG. 1 in a section along the line II—II.
Figure 3:
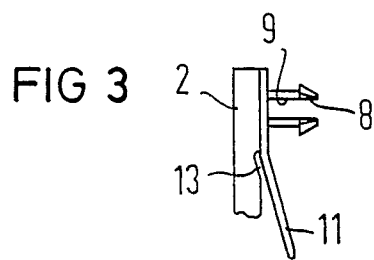
FIG. 3 is a detailed view of a retainer element of the apparatus of FIG. 2.

FIGS. 1 through 3 show an apparatus for guiding and holding printed circuit boards that compensates both for thickness as well as length variations of the printed circuit boards. As may be particularly seen in FIG. 1, the apparatus is composed of two rail parts extending parallel to one another that are referred to below as legs 2. The legs 2 are corrugated in opposite directions relative to one another along the course of the rail. The gap formed between the legs 2 has broadened portions and constrictions. Locations at which the gap is broadened form an antinode. The distance of the legs 2 from one another is selected such that the gap width at constricted locations is slightly smaller than the minimum thickness of the printed circuit boards used. The gap width at locations that are broadened is selected such that they are slightly larger than the maximum thickness of the printed circuit boards used. The rail 1 formed with the two legs 2 is designed such that an antinode respectively occurs at each of the two rail ends.

The legs 2 are joined to one another by connecting webs 3 at regions at which an antinode occurs. At least at these locations, the apparatus has the shape of a U-shaped rail 1, for which reason the initially addressed rail parts are interpreted as legs 2.

When a printed circuit board is inserted between the legs 2 proceeding from the ends of the rail 1, the legs 2 clamp the printed circuit board at constricted locations. In that no connecting webs 3 are provided at the constricted locations, the legs 2 are freely mobile at these locations and can thus act as resilient pressure elements. In this way, the legs 2 adapt to the respective thicknesses of the printed circuit boards and always hold the printed circuit boards firmly without play.

So that the printed circuit boards do not get hung up at those edges residing transversely relative to the slide direction when inserted into the gap formed by the legs 2, those inside edges of the connecting webs 3 that proceed transversely relative to the legs 2 have leading bevels 4. In addition, the inside edges of the legs 2 are provided with introduction bevels 5 at the rail ends, so the gap for the printed circuit board begins with a funnel-like opening.

As may be seen in FIG. 2, the connecting webs 3 have outwardly directed retainer elements 6 in the direction of the legs 2. The retainer elements 6 are fashioned as pins having free ends formed as latch element 7. The retainer elements 6 essentially have the shape of a cylinder. The latch element 7 is formed by a cone that is attached to the cylinder. The base area of the cone is larger than the cover area of the cylinder, so that an initially projecting and then tapering region results. In the exemplary embodiment, the cone is additionally flattened. Instead of the cone, a sphere or, respectively, a sub-sphere, specially a hemisphere, can be attached to the cylinder with a respectively appropriate excess dimension.

The retainer elements 6 used in the exemplary embodiment are composed of only half of a sub-member of the pin member just set forth. The lateral edges arising as a result thereof at the inside surfaces 9 of the member (see FIG. 3) are bevelled in the region of the free ends.

FIG. 2 shows that the retainer elements 6 are arranged in respective pairs on the connecting webs 3 at a distance from one another. The retainer elements 6 are thereby aligned such that the latch elements 7 each respectively point away from one another. In this way, the retainer elements 6 act as spreader jaws that are briefly pressed together upon introduction into a bore and then spread after they have extended through the bore. When an attempt is made to withdraw the retainer elements 6 from the bores, the latch elements 7 reliably hook at the edges of the bores.

In the exemplary embodiment, the connecting webs 3 between the ends of the rail are fashioned twice as long as at the ends themselves. They therefore also have twice as many retainer elements 6 as the connecting webs 3 at the rail ends. As a result the illustrated apparatus is dynamically balanced relative to its transverse axis. One half of the apparatus can therefore be viewed as a base element for further apparatus that arise by joining a plurality of such basic elements.

Spring tongues 11 are secured to those edges of the connecting webs 3 that proceed transversely relatively to the legs 2. The spring tongues 11 are arranged at a slant on sides of the retainer elements 6. The slant and the length of the spring tongues 11 are selected such that the rail 1 presses away from the assembly part 10 (see FIG. 2) to such an extent that the latch elements 7 of the retainer elements 6 hook under spring pressure at the edges of the respectively appertaining bores.

When a printed circuit board 12 is inserted into the gap between the legs 2, the rail 1, depending on the length variations of the printed circuit board 12, is pressed against the assembly part 10 opposite the force of the spring tongues 11, and as a result the retainer elements 6 engage farther through the bores of the assembly part.

The spring tongues 11 are bent when the rail 1 is pressed against the assembly part 10. In order to increase the elasticity and the action of the spring tongues 11, notchings respectively extending into the legs 2 over the edges courses facing toward the legs 2 are provided in the clamping regions of the spring tongues 11.

According to the exemplary embodiment, the spring tongues 11 are omitted at those edges of the connecting webs 3 allocated to the ends of the rail 1 that point toward the rail ends.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Apparatus for guiding and holding printed circuit boards which are guided at opposite edges, composed of an essentially U-shaped rail having at least two legs and having retainer elements directed outward in the direction of the legs and having a leg spacing of the legs that is somewhat greater when compared to the thickness of the printed circuit board and having at least one leg fashioned such that a leg spacing that falls below the thickness of the printed circuit board occurs for at least one location, comprising the legs oppositely corrugated in the direction of the rail; a respective antinode fashioned at ends of the rail; and connecting webs having retainer elements pointing out in a direction opposite that of the legs provided at the ends of the rail and for at least one antinode lying therebetween.

2. The apparatus according to claim 1, wherein the connecting webs are provided with leading bevels at those inside edges proceeding transversely relative to the legs.

3. The apparatus according to claim 1, wherein introduction bevels are provided at the inside edges of the legs at the rail ends.

4. The apparatus according to claim 1, wherein the retainer elements are pins having free ends with at least one latch element.

5. The apparatus according to claim 4, wherein the pins have a substantially cylindrical form and have a projection at their free end that is initially salient and subsequently tapers.

6. The apparatus according to claim 5, wherein the projection is conically fashioned.

7. The apparatus according to claim 5, wherein the projection is spherically fashioned.

8. The apparatus according to claim 4, wherein the pins are composed of at least one sub-member half.

9. The apparatus according to claim 8, wherein the sub-member halves are laterally bevelled in the region of free ends of the sub-member halves.

10. The apparatus according to claim 9, wherein the sub-member halves are arranged in pairs at a distance from one another and have inside surfaces directed respectively toward one another.

11. The apparatus according to claim 1, wherein the retainer elements have a dimension exceeding a specification such that the apparatus is displaceable parallel to a direction of the leg; and wherein spring elements having a respective interactive connection with the retainer elements are provided at sides of the retainer elements, said spring elements having a spring action that compensates for the dimension exceeding the specification.

12. The apparatus according to claim 11, wherein the spring elements are formed by spring tongues projecting at a slant from those edges of the connecting webs proceeding transversely relative to the legs.

13. The apparatus according to claim 12, wherein notchings extending respectively into the legs over the edge courses facing toward the legs are provided in clamping regions of the spring tongues.

14. The apparatus according to claim 1, wherein the apparatus is fashioned as a plastic part.

15. Apparatus for guiding and holding printed circuit boards which are guided at opposite edges, composed of an essentially U-shaped rail having at least two legs and having retainer elements directed outward in the direction of the legs and having a leg spacing of the legs that is somewhat greater when compared to the thickness of the printed circuit board and having at least one leg fashioned such that a leg spacing that falls below the thickness of the printed circuit board occurs for at least one location, comprising the legs oppositely corrugated in the direction of the rail; a respective antinode fashioned at ends of the rail; and connecting webs having retainer elements pointing out in a direction opposite that of the legs provided at the ends of the rail and for at least one antinode lying therebetween, the retainer elements being pins having free ends with at least one latch element.

16. The apparatus according to claim 15, wherein the connecting webs are provided with leading bevels at those inside edges proceeding transversely relative to the legs.

17. The apparatus according to claim 15, wherein introduction bevels are provided at the inside edges of the legs at the rail ends.

18. The apparatus according to claim 15, wherein the retainer elements have a dimension exceeding a specification such that the apparatus is displaceable parallel to a direction of the leg; and wherein spring elements having a respective interactive connection with the retainer elements are provided at sides of the retainer elements, said spring elements having a spring action that compensates for the dimension exceeding the specification.

19. The apparatus according to claim 15, wherein the spring elements are formed by spring tongues projecting at a slant from those edges of the connecting webs proceeding transversely relative to the legs.

20. The apparatus according to claim 15, wherein notchings extending respectively into the legs over the edge courses facing toward the legs are provided in clamping regions of the spring tongues.

21. Apparatus for guiding and holding printed circuit boards which are guided at opposite edges, composed of an essentially U-shaped rail having at least two legs and having retainer elements directed outward in the direction of the legs and having a leg spacing of the legs that is somewhat greater when compared to the thickness of the printed circuit board and having at least one leg fashioned such that a leg spacing that falls below the thickness of the printed circuit board occurs for at least one location, comprising the legs oppositely corrugated in the direction of the rail; a respective antinode fashioned at ends of the rail; connecting webs having retainer elements pointing out in a direction opposite that of the legs are provided at the ends of the rail and for at least one antinode lying therebetween, the retainer elements have a dimension exceeding a specification such that the apparatus is displaceable parallel to a direction of the leg; and spring elements having a respective interactive connection with the retainer elements provided at sides of the retainer elements, said spring elements having a spring action that compensates for the dimension exceeding the specification.

22. The apparatus according to claim 21, wherein the spring elements are formed by spring tongues projecting at a slant from those edges of the connecting webs proceeding transversely relative to the legs.

23. The apparatus according to claim 21, wherein notchings extending respectively into the legs over the edge courses facing toward the legs are provided in clamping regions of the spring tongues.

24. The apparatus according to claim 21, wherein the connecting webs are provided with leading bevels at those inside edges proceeding transversely relative to the legs.

25. The apparatus according to claim 21, wherein introduction bevels are provided at the inside edges of the legs at the rail ends.

26. The apparatus according to claim 21, wherein the retainer elements are pins having free ends with at least one latch element.

* * * * *